(12) United States Patent  (10) Patent No.: US 7,821,291 B2
Mei  (45) Date of Patent: *Oct. 26, 2010

(54) DIGITAL CALIBRATION CIRCUITS, DEVICES AND SYSTEMS INCLUDING SAME, AND METHODS OF OPERATION

(75) Inventor: Shizhong Mei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/265,204

(22) Filed: Nov. 5, 2008

(65) Prior Publication Data

US 2009/0066368 A1    Mar. 12, 2009

Related U.S. Application Data

(63) Continuation of application No. 11/599,889, filed on Nov. 14, 2006, now Pat. No. 7,459,930.

(51) Int. Cl.
    *H03K 17/16*  (2006.01)
    *H03K 19/003* (2006.01)
(52) U.S. Cl. ............................ 326/30; 326/87; 327/112
(58) Field of Classification Search ............... 326/30, 326/82–83, 86–87; 327/108–109, 112
    See application file for complete search history.

(56) References Cited

U.S. PATENT DOCUMENTS

| | | | |
|---|---|---|---|
| 4,908,526 A | 3/1990 | Mefford | 307/263 |
| 5,065,351 A | 11/1991 | Johnston et al. | 364/571.04 |
| 5,239,492 A | 8/1993 | Hartwig et al. | 364/571.01 |
| 5,254,883 A * | 10/1993 | Horowitz et al. | 326/30 |
| 5,287,063 A | 2/1994 | Izawa | 324/601 |
| 5,517,191 A | 5/1996 | Wynne | 341/118 |
| 5,657,456 A | 8/1997 | Gist et al. | 395/280 |
| 5,689,203 A | 11/1997 | Geist | 327/187 |
| 6,009,487 A | 12/1999 | Davis et al. | 710/105 |
| 6,064,224 A * | 5/2000 | Esch et al. | 326/30 |
| 6,160,851 A | 12/2000 | Brown et al. | 375/254 |
| 6,313,776 B1 | 11/2001 | Brown | 341/144 |
| 6,330,193 B1 | 12/2001 | Yu et al. | 365/189.05 |
| 6,330,194 B1 | 12/2001 | Thomann et al. | 365/189.05 |
| 6,333,639 B1 | 12/2001 | Lee | 326/30 |
| 6,384,621 B1 * | 5/2002 | Gibbs et al. | 326/30 |
| 6,414,525 B2 * | 7/2002 | Urakawa | 327/112 |
| 6,452,849 B1 | 9/2002 | Iwamoto | 365/201 |
| 6,459,335 B1 | 10/2002 | Darmawaskita et al. | 330/9 |
| 6,462,591 B2 | 10/2002 | Garrett, Jr. et al. | 327/112 |

(Continued)

*Primary Examiner*—James H. Cho
*Assistant Examiner*—Jason Crawford
(74) *Attorney, Agent, or Firm*—Dorsey & Whitney LLP (57) ABSTRACT

A calibration circuit for matching the output impedance of a driver by calibrating adjustments to the driver is described. The calibration circuit includes a driver circuit with a plurality of calibration transistors configured to receive a plurality of adjustment signals. The calibration circuit also includes a comparator circuit, and a binary searcher. The driver provides a signal corresponding to an output impedance to the comparator circuit. The output impedance signal is compared to a target impedance, and the comparator circuit then provides logic signals to the binary searcher representing whether the output impedance is greater than the target impedance. The binary searcher then selects a type of step size and count direction, in response to the logic signals, to count the number of steps for adjusting the calibration transistors of the driver.

25 Claims, 10 Drawing Sheets

U.S. PATENT DOCUMENTS

| | | | |
|---|---|---|---|
| 6,480,798 B2 | 11/2002 | Lee | 702/107 |
| 6,509,756 B1 | 1/2003 | Yu et al. | 326/30 |
| 6,549,036 B1 | 4/2003 | Lee | 326/83 |
| 6,556,052 B2 | 4/2003 | Garrett, Jr. et al. | 327/108 |
| 6,608,507 B2 * | 8/2003 | Garrett et al. | 327/108 |
| 6,636,821 B2 | 10/2003 | Lawson | 702/107 |
| 6,674,377 B1 | 1/2004 | Li | 341/120 |
| 6,707,421 B1 | 3/2004 | Drury et al. | 342/357.1 |
| 6,771,097 B1 | 8/2004 | Poh Ho et al. | 327/108 |
| 6,772,351 B1 | 8/2004 | Werner et al. | 713/300 |
| 6,792,372 B2 | 9/2004 | Lee | 702/107 |
| 6,799,290 B1 | 9/2004 | Kirihata et al. | 714/719 |
| 6,807,650 B2 | 10/2004 | Lamb et al. | 716/1 |
| 6,812,888 B2 | 11/2004 | Drury et al. | 342/357.13 |
| 6,836,142 B2 * | 12/2004 | Lesea et al. | 326/30 |
| 6,859,068 B1 | 2/2005 | Trivedi et al. | 326/86 |
| 6,870,419 B1 | 3/2005 | Garrett, Jr. et al. | 327/535 |
| 6,894,543 B2 | 5/2005 | Ho et al. | 327/108 |
| 6,897,713 B1 | 5/2005 | Nguyen et al. | 327/541 |
| 6,909,387 B2 | 6/2005 | Li | 341/120 |
| 6,954,391 B2 * | 10/2005 | Baker | 365/207 |
| 6,958,613 B2 | 10/2005 | Braun et al. | 324/601 |
| 6,963,218 B1 * | 11/2005 | Alexander et al. | 326/30 |
| 6,965,839 B2 | 11/2005 | Floyd et al. | 702/85 |
| 6,980,034 B2 | 12/2005 | O'Shaugnessy | 327/111 |
| 7,002,367 B2 | 2/2006 | Yu et al. | 326/30 |
| 7,002,500 B2 | 2/2006 | Li | 341/144 |
| 7,003,043 B2 | 2/2006 | Casper et al. | 375/257 |
| 7,019,556 B2 | 3/2006 | Yoo | 326/30 |
| 7,046,078 B2 | 5/2006 | Nguyen et al. | 327/541 |
| 7,068,193 B2 | 6/2006 | Dempsey et al. | 341/120 |
| 7,078,943 B2 | 7/2006 | Ho et al. | 327/108 |
| 7,093,145 B2 | 8/2006 | Werner et al. | 713/300 |
| 7,126,345 B2 | 10/2006 | Seidel | 324/601 |
| 7,126,510 B2 | 10/2006 | Alon et al. | 341/120 |
| 7,129,738 B2 | 10/2006 | Lin et al. | 326/30 |
| 7,285,977 B2 * | 10/2007 | Kim | 326/30 |
| 7,362,128 B2 * | 4/2008 | Choi et al. | 326/30 |
| 7,423,450 B2 * | 9/2008 | Santurkar et al. | 326/30 |
| 7,459,930 B2 * | 12/2008 | Mei | 326/30 |
| 2004/0217774 A1 * | 11/2004 | Choe | 326/30 |

* cited by examiner

DIGITAL CALIBRATION CIRCUITS, DEVICES AND SYSTEMS INCLUDING SAME, AND METHODS OF OPERATION

CROSS-REFERENCE TO RELATED APPLICATION

This application is a continuation of U.S. patent application Ser. No. 11/599,889, filed Nov. 14, 2006, U.S. Pat. No. 7,459,930. This application is incorporated by reference herein.

TECHNICAL FIELD

This invention relates generally to integrated circuits and, more specifically, to embodiments of circuits and methods for adjusting the impedance of an externally accessible output terminal.

BACKGROUND OF THE INVENTION

Integrated circuits typically include a number of input/output terminals used for communication with external circuitry. Recently developed communication networks can now transmit signals between circuitry at a rate faster than the capacity of many integrated circuits. As data is transmitted at increasingly higher speeds, new circuitry and methods are needed to accurately transmit data between integrated circuits having varying transmission rates. For example, an integrated memory device such as a dynamic random access memory (DRAM) includes both control terminals for receiving memory control signals, and data terminals for bi-directional data communication with an external system or processor. As data are transmitted at higher speeds between the DRAM external terminals, a better design of input/output drivers is needed to maintain desired electrical signaling levels. The output pins of the DRAM are conventionally connected to other circuit components by transmission lines. Ideally, input/output drivers should be designed to improve control of the input/output resistance to prevent impedance mismatch in the transmission lines.

Conventionally, circuits are integrated into an output driver of a memory system to improve communication speeds and reliability. Variations in process, voltage, temperature and other factors may cause the output drivers to overshoot or undershoot desired signal levels. Consequently, the impedance mismatch of the output driver results in reduced timing and voltage margins that impact signal integrity. Therefore, calibration circuits are designed with adjustment transistors for applying adjustment signals to the output driver to properly match the output impedance. Data is transferred more successfully and reflection is minimized when the output driver is designed to better match the required output impedance.

Figure 1:
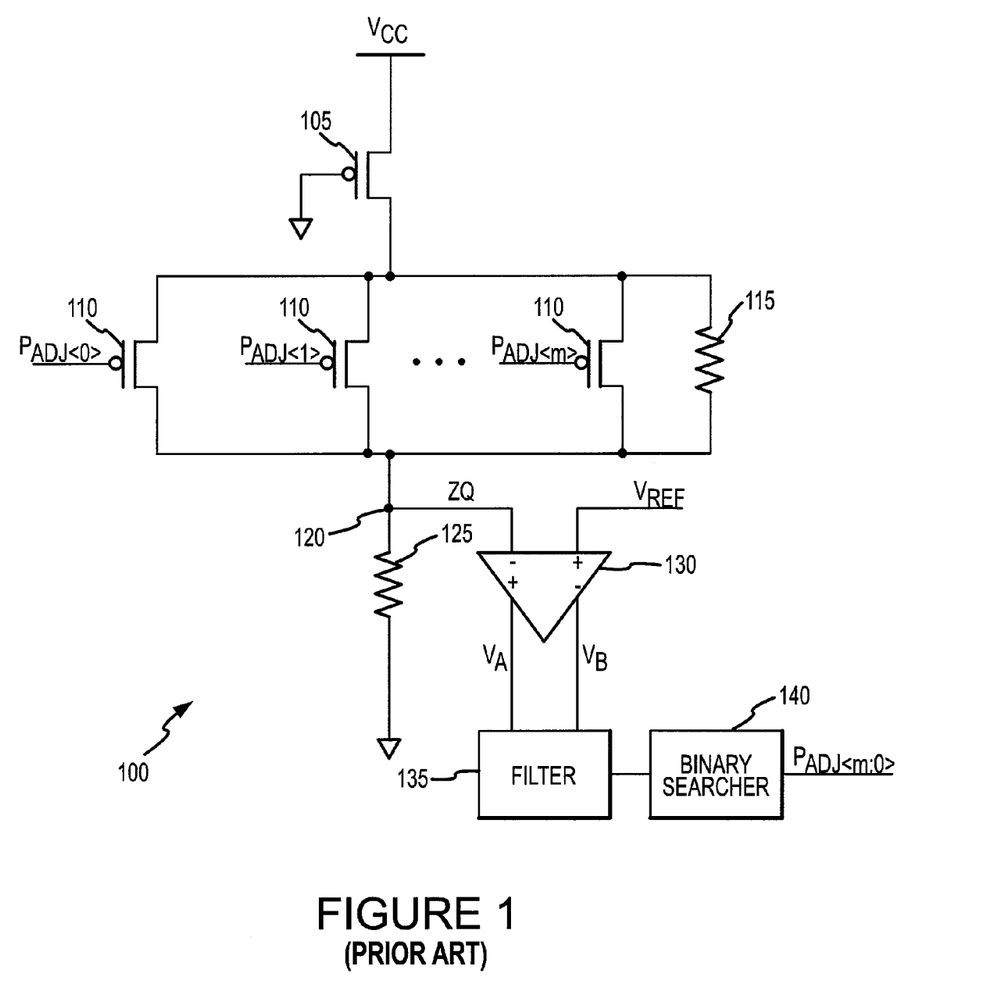
FIG. 1 is a schematic drawing of a conventional calibration circuit.

A conventional digital calibration circuit 100 used by an output driver in DRAM is shown in FIG. 1. A PMOS transistor 105 having a source coupled to a voltage supply includes a drain coupled to the sources of a plurality of PMOS transistors 110 and a resistor 115 in parallel. The drains of the PMOS transistors 110 are coupled to an external resistor 125, which forms a voltage divider whose output is at node 120. The voltage divider replicates a pull-up circuit of the output driver in series with a constant external impedance represented by the resistor 125. During calibration, the PMOS transistors 110 provide adjustments to the output voltage ZQ, which will be further described later. The output voltage ZQ of the voltage divider at node 120 and a reference voltage signal $V_{REF}$ are connected to the inputs of a differential comparator 130. The outputs of the differential comparator 130 are then connected to a filter 135. The output of the filter 135 is in turn coupled to a binary search circuit 140 that generates adjustment signals $P_{ADJ}$<0:m> based on the filtered signals from the filter 135. The adjustment signals $P_{ADJ}$<0:m> are then returned to the adjustment transistors 110 in a feedback loop to update or adjust the output voltage ZQ until it is approximately equal to $V_{REF}$. The adjustment transistors 110, the filter 135 and the binary search circuit 140 will now be described in detail.

As explained, the voltage divider configuration of the calibration circuit 100 is designed to replicate a pull-up circuit of the output driver to determine the proper adjustment for matching the pull-up output impedance. In operation, the gate of the PMOS transistor 105 is coupled to ground to keep the PMOS transistor 105 constantly turned ON in order to mimic the pull-up circuit of the output driver when in operation to calculate the adjustment signal for calibrating the pull-up output impedance. The PMOS transistor 105, when turned ON, couples the adjustment transistors 110 and resistor 115 to the voltage supply $V_{CC}$. Each adjustment transistor 110 is designed to have twice the width of the preceding transistor of the parallel configuration. The parallel configuration of the adjustment transistors 110 has a total transistor width, and hence a conductance, of $2^m * W_P$, where m+1 represents the total number of transistors and $W_P$ represents the width of the first transistor. Each adjustment transistor 110 provides an adjustment step to the output voltage ZQ when selected.

The adjustment transistors are selected when the gate of the transistor 110 receives a LOW $P_{ADJ}$<0:m> signal assignment for that particular transistor 110 from the adjustment signal $P_{ADJ}$<0:m> provided by the binary searcher 135. Adjustment transistors 110 are selected according to the adjustment signal $P_{ADJ}$<0:m> in a feedback configuration from the binary searcher 140 after a comparison is made between the output voltage ZQ to the reference voltage signal $V_{REF}$, and an adjustment is calculated. The reference voltage signal $V_{REF}$ is typically set to VCC/2. The comparator 130 generates two output signals, $V_A$ and $V_B$, having three possible states as a result of the comparison. When the input voltages ZQ and $V_{REF}$ are comparable and cannot be distinguished, the comparator 130 makes $V_A$ and $V_B$ both either high or low, depending on the design of the comparator 130. If the output voltage ZQ is less than $V_{REF}$, then the comparator 130 makes $V_A$ high and $V_B$ low. If the output voltage ZQ is greater than $V_{REF}$, then the comparator 130 makes $V_A$ low and $V_B$ high. Due to noise and other limitations of the comparator 130, the output signals $V_A$ and $V_B$ may not stabilize to a particular state within the allotted time by the comparator, although statistically they represent a particular state.

The signals $V_A$ and $V_B$ are sent to the filter 135 so that the particular states of the output signals $V_A$ and $V_B$ may be sufficiently resolved. As a consequence of noise and the finite response time of the comparator 130, $V_A$ and $V_B$ may not settle on a particular state although statistically they represent a particular state. The filter 135 is designed to determine the correct state represented by $V_A$ and $V_B$. The filter 135 has predetermined threshold values and a pre-defined time to reach the threshold values, and provides a signal to the binary searcher 140 indicating whether $V_A$ is greater than or less than $V_B$ based on which predetermined threshold value is reached first. If neither of the threshold values are reached after the pre-defined time, the filter 135 signals to the binary searcher 140 that $V_A$ equals $V_B$.

The binary searcher 140 makes a decision to either stop the calibration or adjust the adjustment signals $P_{ADJ}$<m:0> based on the resulting signal from the filter 135. As further calibration of the adjustment signal $P_{ADJ}$<m:0> is needed, the binary searcher 140 generates a control signal to iteratively adjusts the signals $P_{ADJ}$<m:0> by a particular step size that depends on the selected combination of adjustment transistors 110. Initially, the binary searcher 140 begins the calibration by instructing the last adjustment transistor to turn ON, generating a signal $P_{ADJ}$<m> whose width is approximately half of the total width of adjustment transistors, $\frac{1}{2}(2^m*W_P)$. From this midpoint, the binary searcher 140 may provide further instructions to adjust upward or downward in iterative steps to calibrate the voltage output ZQ as close as possible to the reference $V_{REF}$. With each iteration, the step size is reduced by half the width of the previous step. For example, if the first iteration turns ON adjustment transistors 110 having a width $2^m*W_P$, then the second iteration will turn ON adjustment transistors 110 having a width of $\frac{1}{2}(2^m*W_P)$, the third iteration will turn ON transistors having a width of $\frac{1}{4}(2^m*W_P)$, and so forth. Since there are a total of m+1 transistors 110, each set of adjustments are limited by a total of m steps, with the end objective being to match the output voltage ZQ as closely as possible to the reference voltage $V_{REF}$. The binary searcher 140 adjusts the adjustment signal $P_{ADJ}$<m:0> such that when it stops, the ZQ voltage equals or approximates $V_{REF}$, and accordingly, the resistance of the replicated pull-up circuit of the driver equals or approximates the external resistance of resister 125. If after m steps, the adjustment signal $P_{ADJ}$<m:0> requires further calibration, the binary searcher 140 repeats the iterative steps, starting once again from the midpoint until the ZQ voltage is closely matched to $V_{REF}$ or the searcher finishes in steps. The final adjustment signal $P_{ADJ}$<m:0> is then provided to the output driver for properly adjusting the output impedance.

Although the calibration circuit 100 sufficiently matches the output impedance of the output driver to the impedance of the resistor 125, the filtering time of the filter 135 may be unnecessarily long for evaluating ZQ and $V_{REF}$ signals. In the case of when the difference in magnitude between the voltage ZQ and the voltage $V_{REF}$ is large, the threshold values are likely determinable irrespective of noise and other minor interferences, therefore the signals may be assessed without significant filtering. One problem with the conventional calibration circuit 100 is the filter 135 and the binary search 140 do not discriminate between when the difference in magnitude of the ZQ and $V_{REF}$ voltages are large or small. In the conventional calibration circuit 100, the filter 135 is induced to unnecessarily filter signals whose states are determinable, and therefore prolonging the calibration time.

Another problem associated with the conventional calibration circuit 100 is that excessive over-compensation may occur as the binary searcher 140 iteratively adjusts the adjustment signal $P_{ADJ}$<m:0> by a particular step size that may be larger than the difference in magnitude of ZQ and $V_{REF}$. Additionally, the binary searcher 140 may be forced to excessively repeat the iterative process until a sufficient adjustment is determined due to over-compensation, which results in further delays. For ZQ and $V_{REF}$ voltages whose magnitudes are closer together, it is not necessary to make adjustments with large step sizes that only results in over-compensation. Typically over-compensated adjustments require recalibration and re-adjustments, and unnecessarily prolongs the overall calibration time of the system.

Although the problems and limitations described above have been explained in the context of the pull-up circuitry of a driver, it should be understood that calibration circuits for calibrating the output impedance of pull-down circuitry using NMOS transistors are also subject to the same limitations and problems. There is therefore a need for a more efficient calibration circuit capable of more quickly detecting the difference in magnitude between the output voltage ZQ and the reference voltage $V_{REF}$ to adjust the step size accordingly, thereby reducing the overall calibration time.

DETAILED DESCRIPTION

Embodiments of the present invention are directed to circuits providing adjustments to match the impedance of an externally accessible output terminal. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
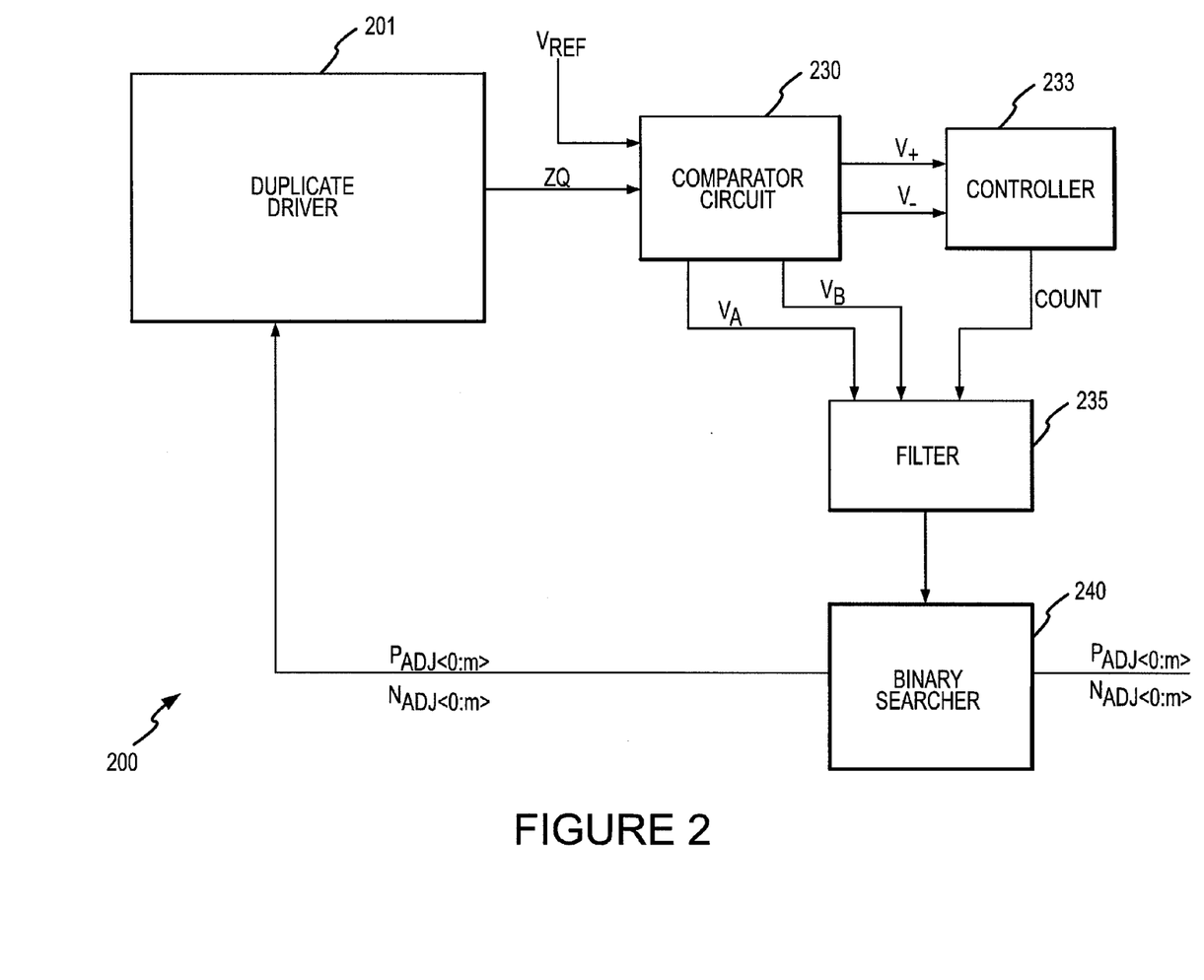
FIG. 2 is a block diagram of a calibration circuit according to an embodiment of the invention.

FIG. 2 shows a simplified block diagram of a calibration circuit 200 according to one embodiment of the invention, which may be adapted for an output driver to provide an impedance adjustment signal to match the driver to the impedance of external output terminals. The calibration circuit 200 includes a duplicate driver 201 like the circuit shown in FIG. 1, replicating the actual output driver to which impedance adjustment signals will be provided. The replica driver 201 outputs a voltage signal ZQ, mimicking the output signal DQ of the actual output driver as explained with reference to FIG. 1. A comparator 230 receives the voltage signal ZQ to compare to a reference voltage $V_{REF}$. As in the conventional comparator 130 of FIG. 1, the comparator 230 generates two output signals $V_A$ and $V_B$ having three possible states. If the output voltage ZQ is less than $V_{REF}$, then the comparator 230 makes $V_A$ high and $V_B$ low. If the output voltage ZQ is greater than $V_{REF}$, then the comparator 230 makes $V_A$ low and $V_B$ high. If the magnitudes of ZQ and $V_{REF}$ are so similar or substantially the same, then the comparator 230 makes $V_A$ and $V_B$ both either low or high. Additionally, the comparator circuit 230 is designed to compare the signal ZQ to a voltage above the reference voltage, $V_{REF}$+DELTA, and a voltage below the reference voltage, $V_{REF}$−DELTA, to determine the extent to which the signal ZQ differs from the reference voltage $V_{REF}$. The comparator 230 then provides signals $V^+$ and $V^-$ to a controller 233, and the voltage signals $V_A$ and $V_B$ to a filter 235, as a result of the comparison.

As described, the controller 233 receives the signals $V^+$ and $V^-$ after the comparator circuit 230 determines how closely the magnitude of signal ZQ compares to reference voltages above and below the reference $V_{REF}$. The controller 233 then sends a control signal COUNT to the filter 235, instructing the filter 235 how to assess the signals $V_A$ and $V_B$. If $V^+$ and $V^-$ are HIGH, then the controller 233 indicates to the filter 235 that ZQ is less than $V_{REF}$–DELTA, which does not require filtering since ZQ is definitively smaller than $V_{REF}$. If $V^+$ and $V^-$ are LOW, then the controller indicates to the filter 235 that ZQ is greater than $V_{REF}$+DELTA, which also requires no filtering since ZQ is definitively greater than $V_{REF}$. If $V^+$ is HIGH and $V^-$ is LOW, then the state of the signal ZQ is somewhere in the middle range, where ZQ is greater than $V_{REF}$–DELTA but less than $V_{REF}$+DELTA. When ZQ is greater than $V_{REF}$–DELTA but less than $V_{REF}$+DELTA, the signal ZQ may be undeterminable due to noise and other interferences as previously described. The controller 233 then instructs the filter 235 to proceed with the normal filtering process, and the received signals from the comparator circuit 230 are filtered in the same manner as the conventional filter 130 functions to determine the particular states of the output signals $V_A$ and $V_B$. The controller 233 reduces the overall calibration time by instructing the filter 235 when to filter the received signals, and bypassing the filtering step when ZQ is significantly greater than or less than the reference voltage $V_{REF}$. Alternatively, the controller 233 may be designed to send the control signal COUNT directly to the improved binary searcher 240 instead of having all its control signals first pass through the filter 235.

Similar to the conventional binary searcher 135 of FIG. 1, the binary searcher 240 determines whether to calibrate the voltage output ZQ or to stop the calibration depending on the signal received from the filter 235. The binary searcher 240 of FIG. 2, however, is enabled to generate adjustment signals for using different adjustment step sizes depending on the difference in magnitude between the output voltage ZQ and reference voltage $V_{REF}$ assessed by the controller 233 and filter 235. When the voltage signal ZQ is significantly greater than or less than $V_{REF}$ (condition in which signals $V^+$ and $V^-$ received by the controller 233 are both HIGH or both LOW), the binary searcher 240 functions in the same manner as the conventional binary searcher 140 of FIG. 1, and uses relatively large step sizes. When the magnitude of ZQ is close in magnitude to $V_{REF}$, where ZQ is greater than $V_{REF}$–DELTA but less than $V_{REF}$+DELTA, the improved binary searcher 235 adjusts the signal at most twice with smaller step sizes. The smaller step size adjustments prevent the calibration circuit 200 from over-compensating the adjustment, and avoid the need to re-calibrate the signal due to the over-compensation.

The binary searcher 240 checks the adjustments that were updated on the adjustment signal $P_{ADJ}$<0:m> by feeding the adjustment signal back to the duplicate driver 201 for another comparison. The binary searcher 240 continues to return the adjustment signal back to the duplicate circuit 201 until the output signal ZQ matches the reference $V_{REF}$ and a final adjustment signal $P_{ADJ}$<0:m> is ready to be sent to the actual output driver (not shown). Although the adjustment signal $P_{ADJ}$<0:m> of the pull-up driver using PMOS transistors has been described in detail, the calibration circuit 200 may be adapted to replicate a pull-down circuit of the output driver using NMOS transistors and generate an adjustment signal to calibrate the pull-down impedance of the driver.

Figure 3:
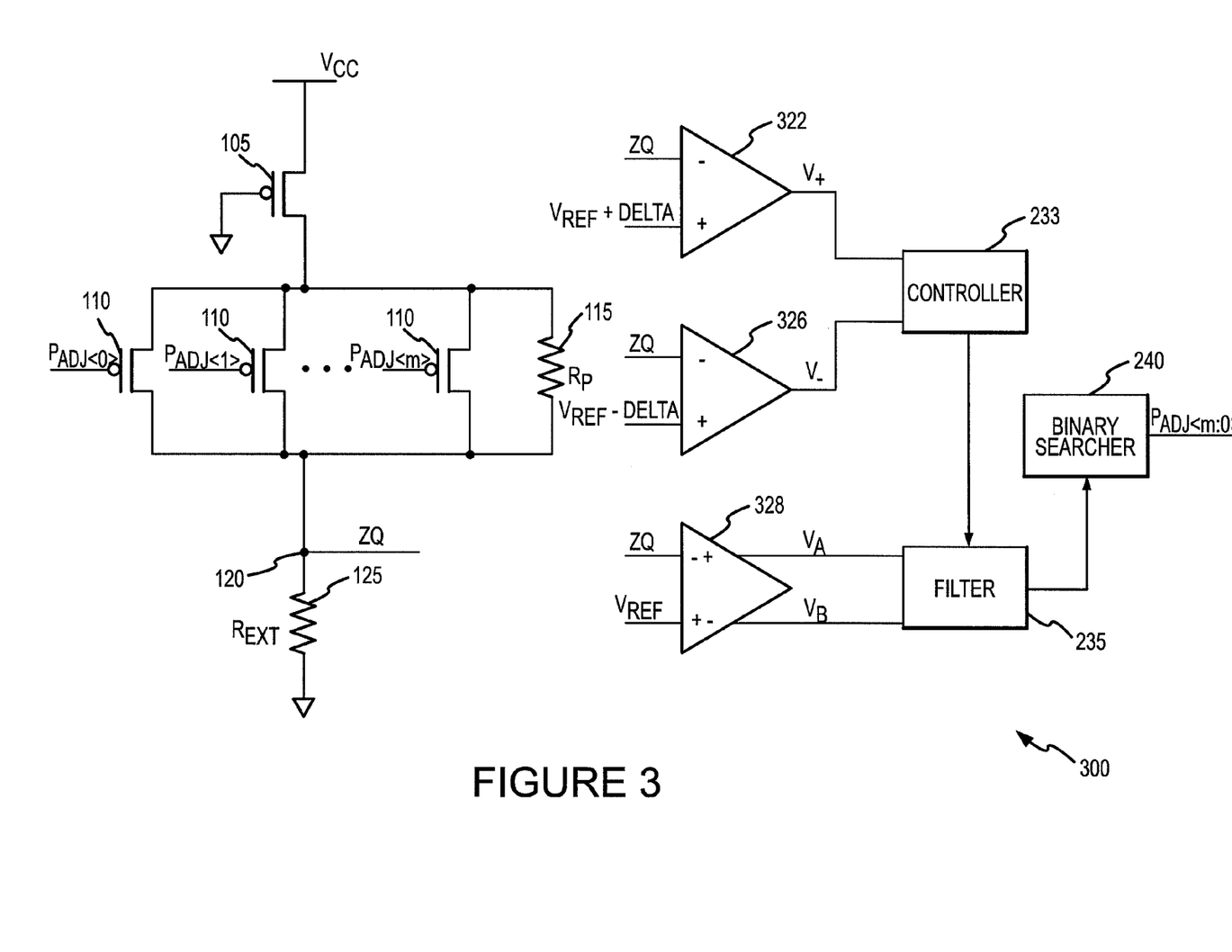
FIG. 3 is a schematic drawing of a calibration circuit according to an embodiment of the invention of FIG. 2.

FIG. 3 shows, schematically, an embodiment of circuitry that may be used in the calibration circuit 200 of FIG. 2. A calibration circuit 300 includes a replica of the pull-up circuit of an output driver having essentially the same components as the pull-up circuit of the conventional calibration circuit 100 of FIG. 1. In the interest of brevity, these same components will not be described again in detail. The calibration circuit 300 also includes three comparators 322, 326, 328 for comparing the output signal ZQ to the reference voltage $V_{REF}$, and to voltages above and below the reference voltage $V_{REF}$. The comparator 322 compares ZQ to a voltage $V_{REF}$+DELTA, that is above the reference voltage $V_{REF}$ by DELTA, and outputs a voltage $V^+$ as a result of the comparison. The comparator 326 compares ZQ to a voltage $V_{REF}$–DELTA, that is below the reference voltage $V_{REF}$ by DELTA, and outputs a voltage $V^-$ as a result of the comparison. The voltage signals $V^+$ and $V^-$ are then sent to the controller 233 to evaluate the difference in magnitude between the ZQ and $V_{REF}$ in the manner previously described. The comparator 328 is essentially the same as the comparator 130, and compares ZQ to the reference $V_{REF}$ to generate signals $V_A$ and $V_B$, which are then provided to the filter 235. As previously described, if ZQ is greater or less than $V_{REF}$ by DELTA, then $V_A$ and $V_B$ are definitive and do not need to be filtered. Signals $V_A$ and $V_B$ are then processed for the binary searcher 240 to iteratively determine the necessary steps to generate the adjustment signal $P_{ADJ}$<0:m>. If the magnitudes of ZQ and $V_{REF}$ are closer such that ZQ is greater than $V_{REF}$–DELTA but less than $V_{REF}$+DELTA, then signals $V_A$ and $V_B$ are not definitive and are filtered by the filter 235 before instructions are sent to the binary searcher 240. Since the magnitude of ZQ and $V_{REF}$ are closer in value, the binary searcher 240 applies the smaller adjustments of step sizes 2 and 1 to $P_{ADJ}$<0:m> to avoid overcompensating the adjustment. The working principle of the binary searcher 240 will now be described in more detail.

Figure 4:
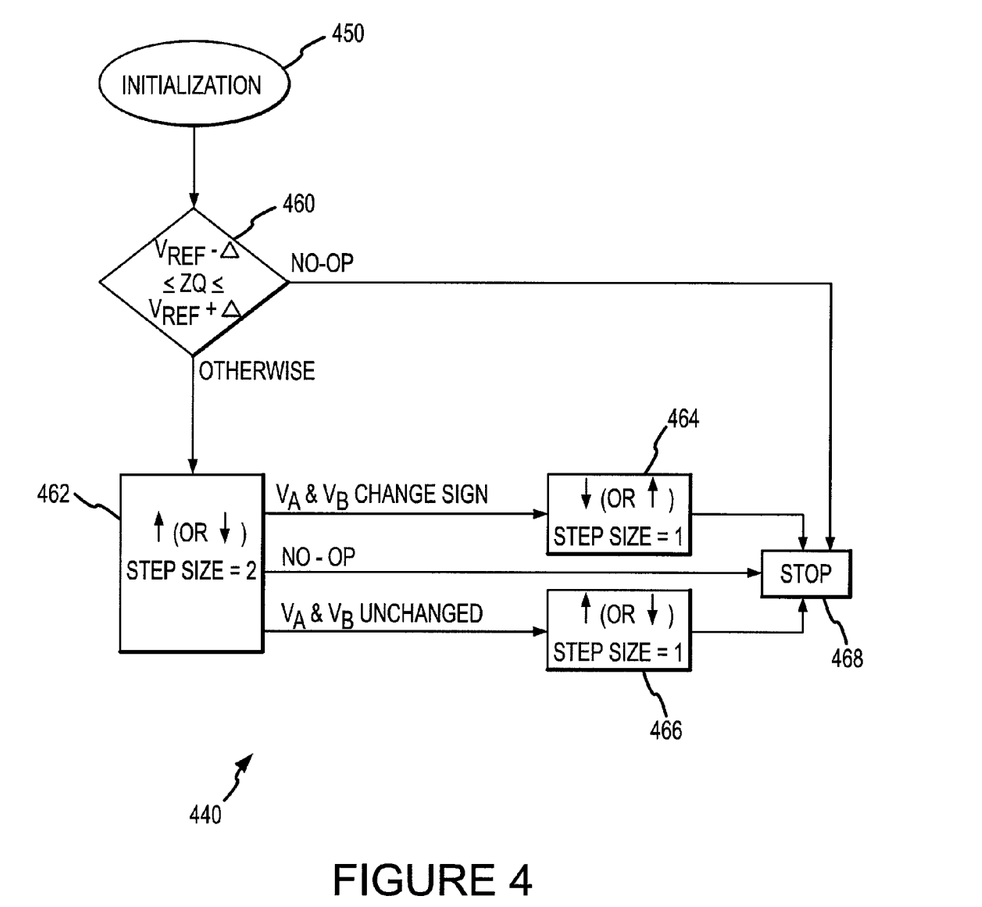
FIG. 4 is a flow diagram illustrating the operation of a binary searcher in the calibration circuit of FIG. 2 according to an embodiment of the invention.

A flow diagram, shown in FIG. 4, illustrates how the operation of the binary searcher 240 of FIG. 2 does not overcompensate the signal adjustments when the magnitude of the output voltage ZQ and the reference voltage $V_{REF}$ are close to each other. In other conditions, where ZQ is definitively greater than or less than $V_{REF}$, the binary searcher 240 functions similarly to the convention binary searcher 140 of FIG. 1, which has been described in detail. However, when the filter 235 indicates ZQ is greater than $V_{REF}$–DELTA but less than $V_{REF}$+DELTA, due to the state of ZQ, the binary searcher 240 at box 460 expects one of three results from the filter 235 after received signals $V_A$ and $V_B$ are filtered: the value of $V_A$ is high and the value of $V_B$ is low, the value of $V_A$ is low and the value of $V_B$ is high, or the value of $V_A$ and $V_B$ may be indeterminable after a predefined time and the filter 235 concludes that $V_A$ equals $V_B$. If the filter 235 has exhausted the predefined time before either threshold value is reached, then the binary searcher 240 processes a No-Op operation, where the calibration is stopped at box 468 since $V_A$ equals $V_B$, and therefore ZQ is equal to $V_{REF}$. Otherwise, the binary searcher 240 adjusts either $V_A$ or $V_B$ by two step sizes at box 462, and may additionally adjust either signal by another step size at box 464. Alternatively, depending on the signal from the filter 235, received signals $V_A$ or $V_B$ may need only the two step adjustment at 462 and then stopped indicated by the No-Op to the stop box 468. The received signals may only need a one step size adjustment at box 466 for a finer adjustment, and then stopped at 468. The adjustments to $V_A$ and $V_B$ by the binary searcher 240 are preserved in the adjustment signal $P_{ADJ}$<0:m>, which is then sent to the actual output driver for adjusting the impedance.

Figure 5:
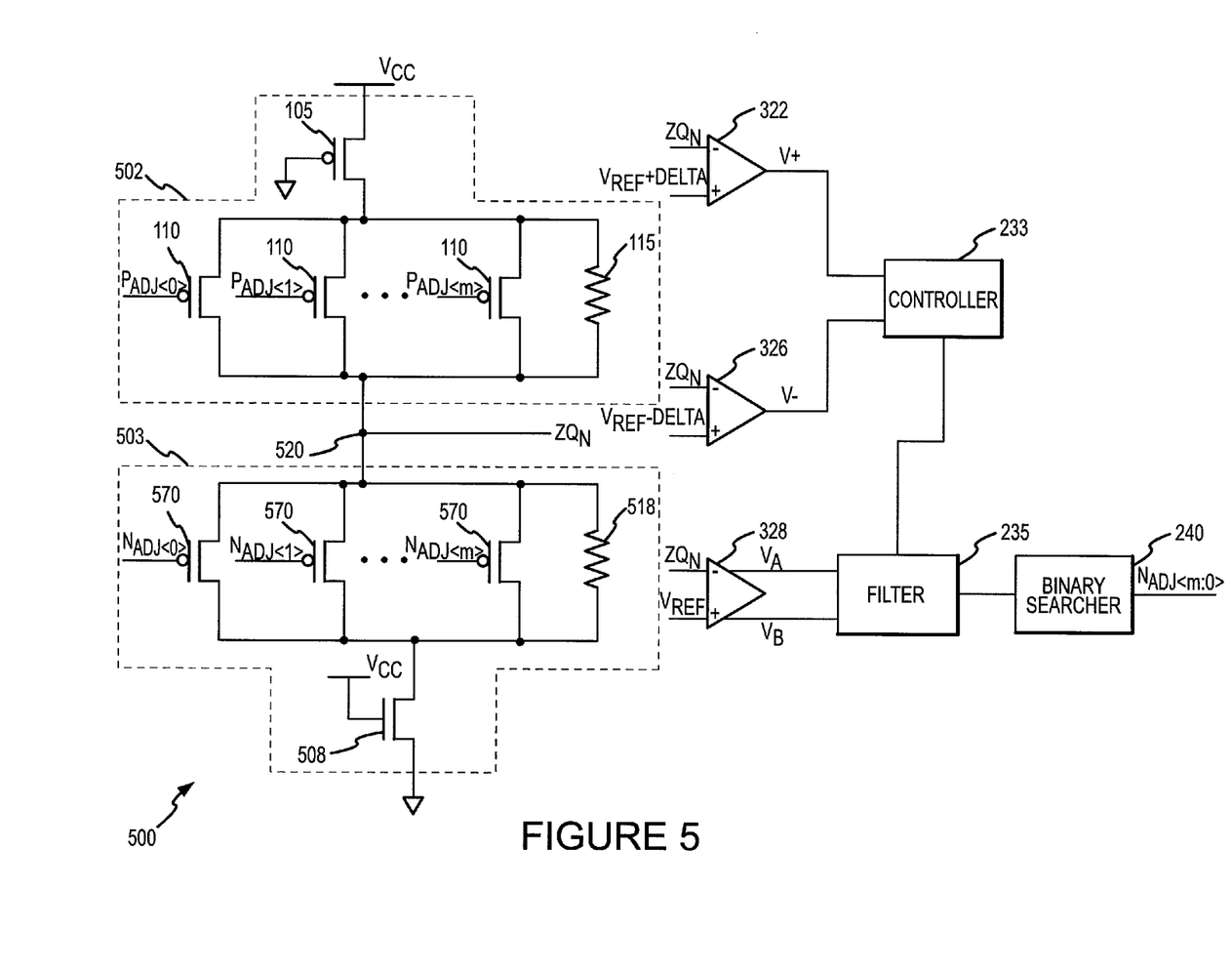
FIG. 5 is a schematic drawing of a calibration circuit according to another embodiment of the invention of FIG. 2.

The duplicate driver 201 of FIG. 2 may additionally include a replica pull-down circuit 503 as shown in a calibration circuit 500 of FIG. 5. Once the pull-up resistance is matched to the external resistance 125, a pull-down resistance can be matched to the pull-up resistance using the pull-down circuit 503 and an adjusted pull-up circuit 502. The pull-up circuit 502 and the pull-down circuit 503 are configured to be a voltage divider having an output voltage $ZQ_N$ at node 520. The pull-up circuit 502 includes components that are the same as the adjustment transistors 110 and the resistor 115 of the replica pull-up circuit in FIG. 3. The pull-down circuit 503 is also designed with the same number of adjustment transistors 110 in the pull-up circuit 502, except that all the pull-down transistors 570 are NMOS and controlled by an adjustment signal $N_{ADJ}$<0:m> for adjusting the pull-down impedance of the driver. Similarly, the pull-down adjustment transistors 570 are connected in parallel to a resistor 518 that represents the output resistance of the actual drive held at a constant value for the purposes of calibration. The source of the adjustment transistors 570 are coupled to drain of an NMOS transistor 508, whose source is coupled to ground. The transistor 508 generally controls the operation of the pull-down adjustment transistors, but for the purposes of calibrating an adjustment signal, the transistor 508 is turned ON at all times by coupling the gate to the voltage supply. The calibration circuit 500 additionally includes three comparators 322, 326, 328, the controller 233, the filter 235, and the binary searcher 240 that are essentially the same as those employed in the calibration circuit 300 of FIG. 3. In the interest of brevity, these elements will not be described again. For calibrating the pull-down impedance, the binary searcher 240 generates the pull-down adjustment signal $N_{ADJ}$<0:m> in essentially the same manner as the pull-up adjustment signal $P_{ADJ}$<0:m>.

Figure 6:
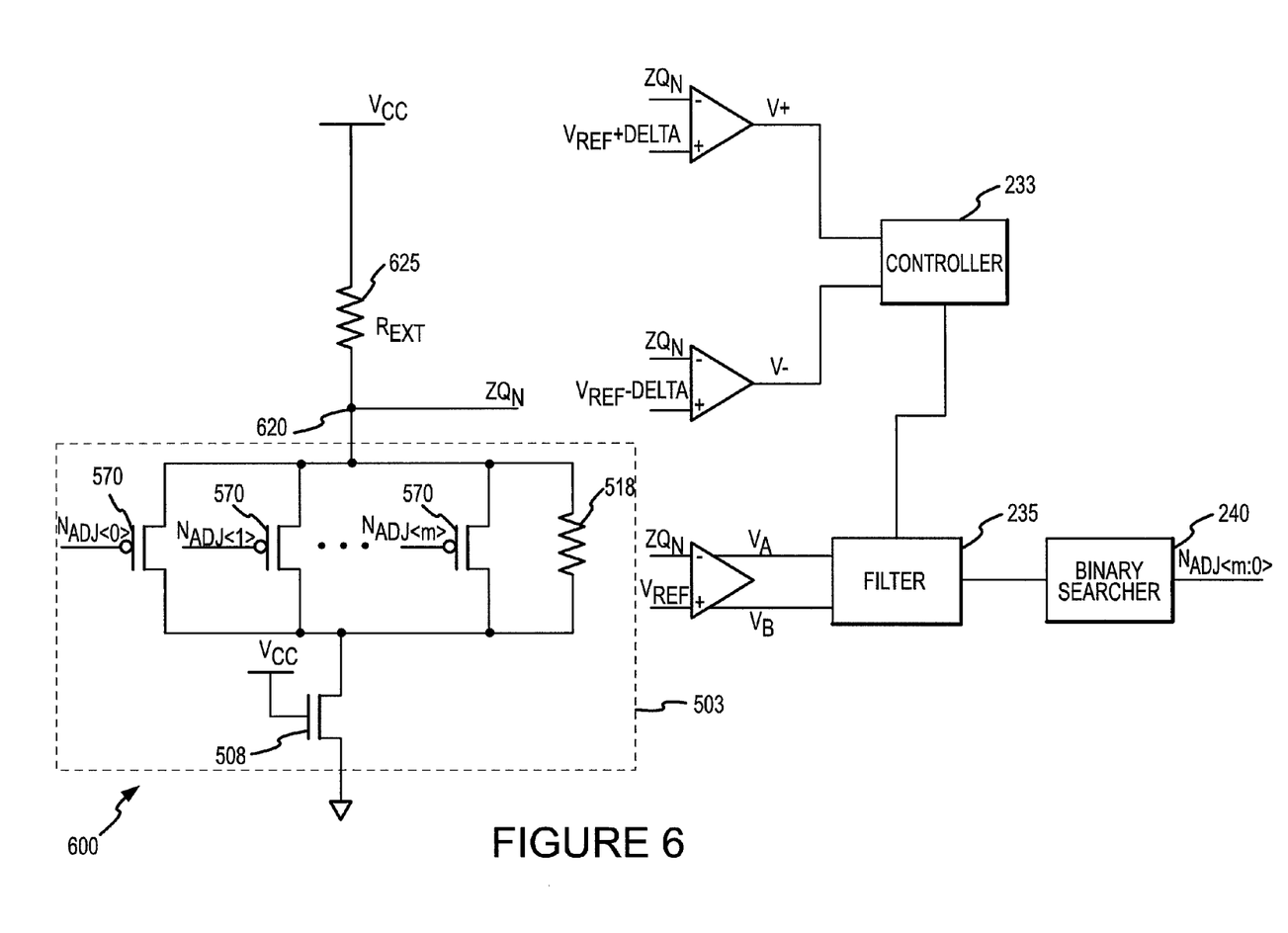
FIG. 6 is a schematic drawing of a calibration circuit according to another embodiment of the invention of FIG. 2.

In another embodiment of the calibration circuit 200, FIG. 6 shows a calibration circuit 600 having the pull-down circuit 503 coupled to an external resistor 625. The pull-down circuit 503 of FIG. 6 is the same pull-down circuit 503 of FIG. 5. The output impedance of pull-down circuit 503 can be matched to any external resistance selected for the resistor 625. Additionally, the pull-down impedance can be matched to the external resistor 625 first and then matching the pull-up impedance to the matched pull-down impedance in reverse order of the calibration circuit 500 of FIG. 5. The external resistance 625 is connected to the pull-down circuit 503 to be a voltage divider having an output voltage $ZQ_N$ at node 620. The calibration circuit 600 additionally includes three comparators 322, 326, 328, the controller 233, the filter 235, and the binary searcher 240 that are essentially the same as those employed in the calibration circuit 300 of FIG. 3.

Figure 7:
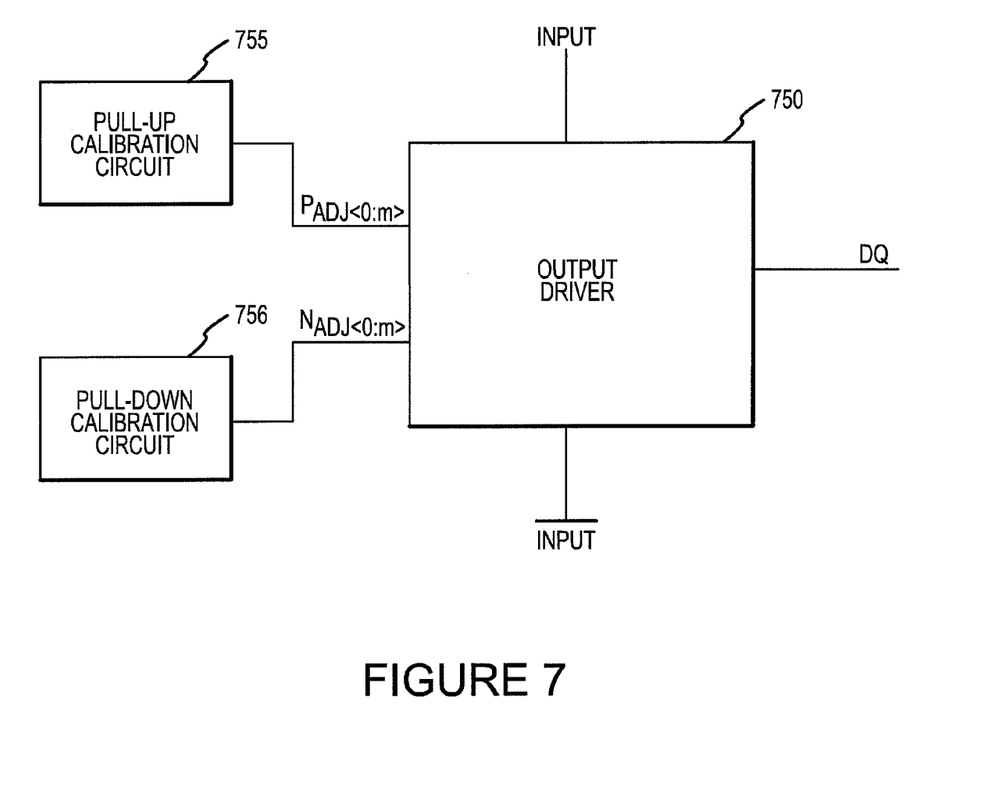
FIG. 7 is a block diagram of an output driver receiving adjusted impedance calibration signals according to an embodiment of the invention.

FIG. 7 is a block diagram depicting an output driver 750 receiving adjusted impedance calibration signals $P_{ADJ}$<0:m> and $N_{ADJ}$<0:m> according to an embodiment of the invention. The output driver 750 is coupled to a pull-up calibration circuit 755, and receives the adjustment signal $P_{ADJ}$<0:m> to properly match its pull-up impedance with the output impedance of an external terminal. The output driver 750 is also coupled to a pull-down calibration circuit 756, and receives the adjustment signal $N_{ADJ}$<0:m> for matching its pull-down impedance to the pull-up impedance already calibrated to the external impedance. The pull-up calibration circuit 755 may be the same as in the calibration circuit 300 of FIG. 3 and the pull-down calibration circuit 756 may be the same as in the calibration circuit 500 of FIG. 5. In response to a clock signal (not shown), the output driver 750 receives an input signal INPUT and a complimentary signal to INPUT, which represent data from memory or signals to initiate the operation for adjusting the driver impedance according to the adjustment signals $P_{ADJ}$<0:m> and $N_{ADJ}$<0:m>, and generating a properly matched output driver signal DQ.

Figure 8:
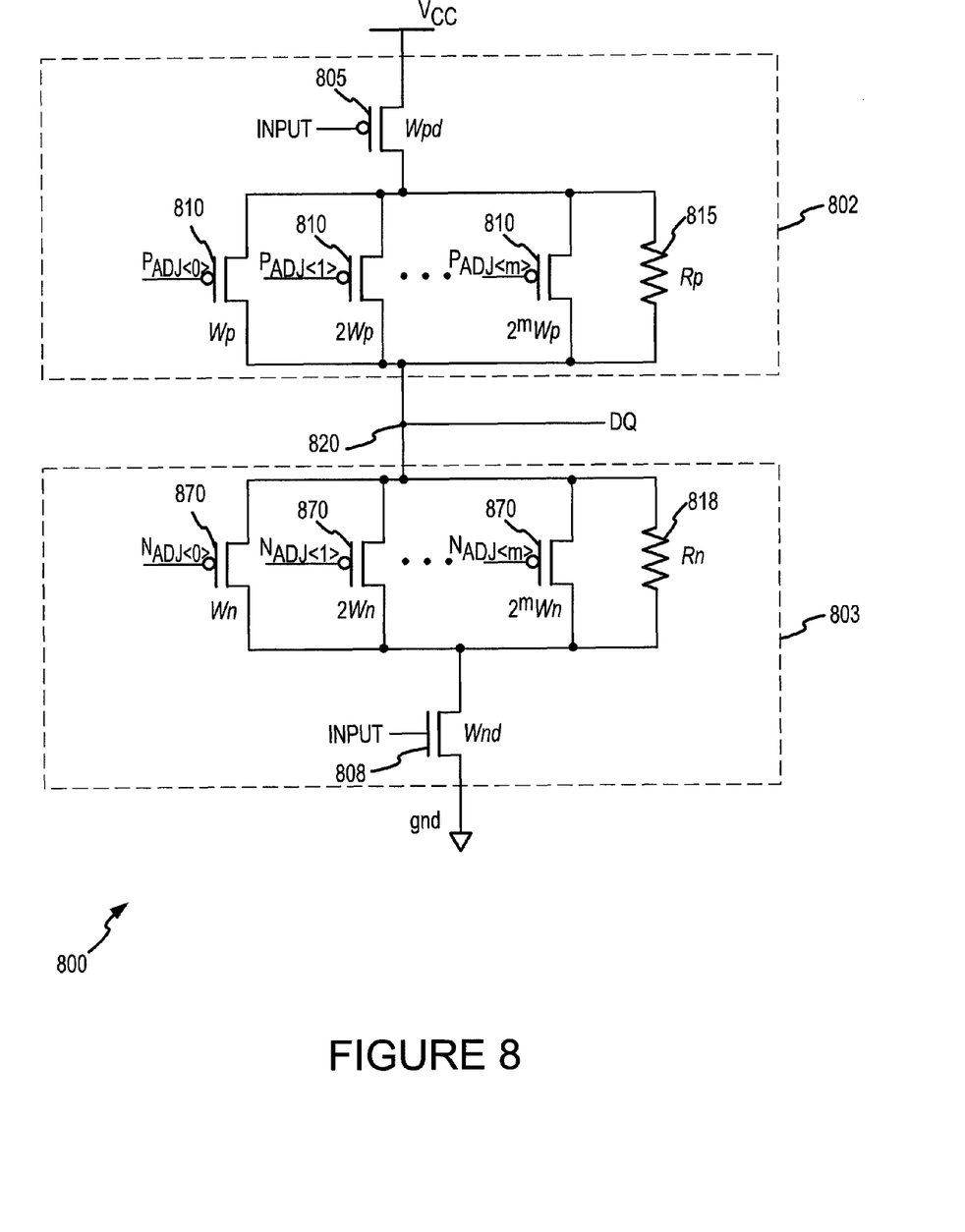
FIG. 8 is a schematic drawing of an output driver of FIG. 7 receiving adjusted impedance calibration signals according to another embodiment of the invention.

FIG. 8 is a schematic of an output driver circuit 800 which may be used as the output driver 750 of FIG. 7. The output driver circuit 800 includes a pull-up circuit 802 having PMOS adjustment transistors 810 and an output resistor 815 configured similarly to the components of the replica pull-up circuit 503 of FIG. 5. The PMOS adjustment transistors 810 are selected by the adjustment signal $P_{ADJ}$<0:m> provided by the pull-up calibration circuit 755 (not shown) to calibrate the pull-up impedance of the driver circuit 800. The operation of the pull-up circuit 802 is controlled by a transistor 805 whose drain is coupled to the voltage supply VCC and source is coupled to the pull-up circuit 802. The gate of transistor 805 is coupled to a signal that is complimentary to the input signal INPUT. The output driver circuit 800 also includes a pull-down circuit 803 having NMOS adjustment transistors 870 and an output resistor 818 configured similarly to the components of the replica pull-down circuit 503. The NMOS adjustment transistors 870 are selected by the adjustment signal $N_{ADJ}$<0:m> provided by the pull-down calibration circuit 756 (not shown) to calibrate the pull-down impedance of the driver circuit 800. Similarly to the pull-up circuit 802, the operation of the pull-down circuit 503 is controlled by an NMOS transistor 808 whose drain is coupled to the pull-down circuit 803, source is coupled to ground, and when the gate of the transistor 808 receives the input signal INPUT. The pull-up circuit 802 and the pull-down circuit 803 are arranged to form a voltage divider to properly generate an output DQ at node 820 as a result of the output driver circuit 800 having the driver impedance properly matched.

Although the embodiments thus far have been described in the context of calibration circuits having replica drivers 502, 503 that resemble the structure of the output driver circuit 800, the calibration circuit 500 may be designed to be coupled directly to the actual driver circuits 802, 803, thereby eliminating the need of additional replica drivers 502, 503. Moreover, the calibration circuits 300, 500 may be coupled external to the output driver circuit 800 or incorporated internal to the output driver circuit 800 within an integrated memory device.

Figure 9:
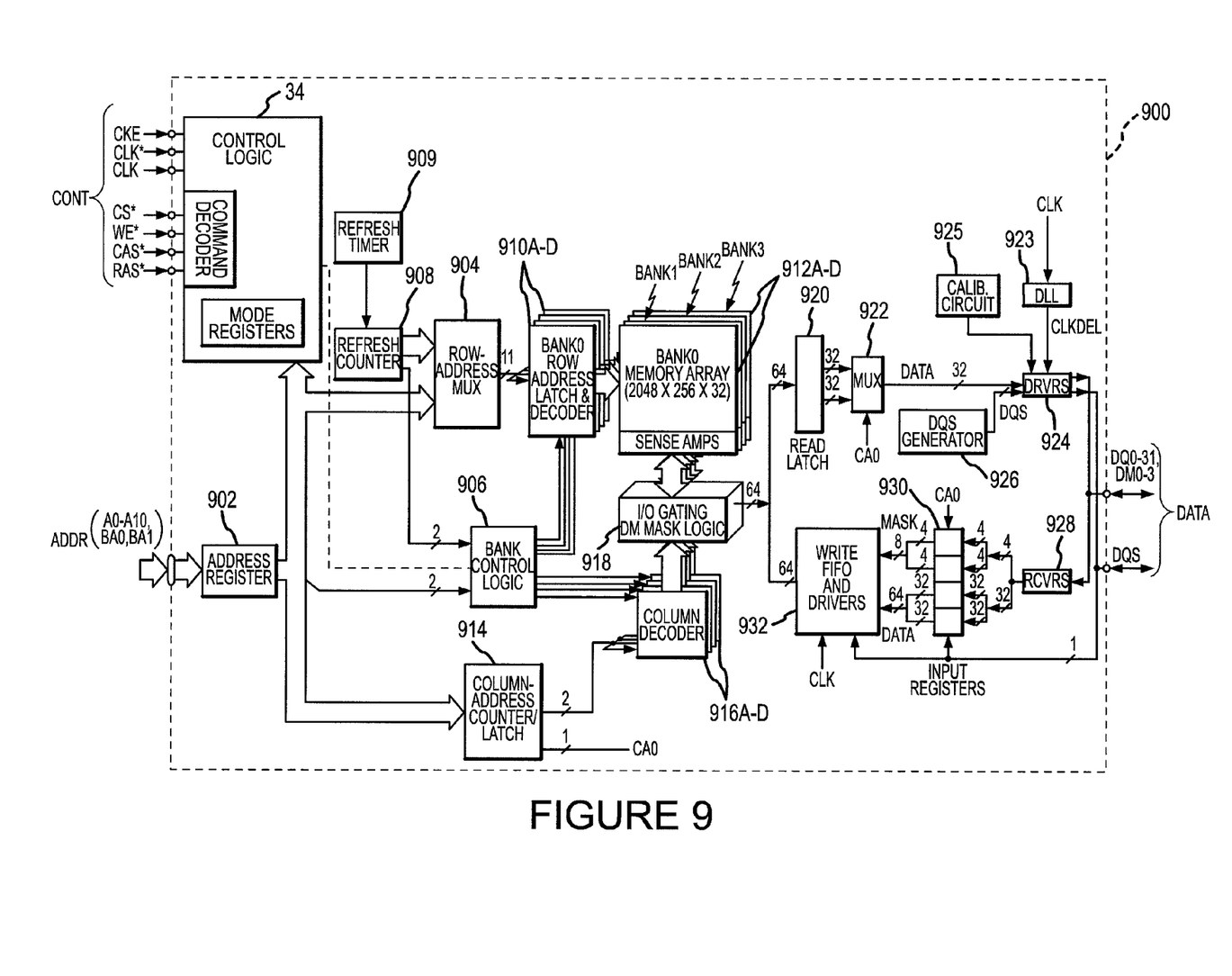
FIG. 9 is a functional block diagram illustrating a memory device including a calibration circuit according to an embodiment of the invention.

FIG. 9 is a functional block diagram of a memory device 900 having drivers that include the calibration circuit 200 of FIG. 2. The memory device 900 in FIG. 9 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A-D. The bank control logic 906 activates the row address latch and decoder 910A-D corresponding to either the bank address received from the address register 902 or a refresh bank address from the refresh counter 908, and the activated row address latch and decoder latches and decodes the received row address. A refresh timer 909 may be coupled to the refresh counter 908 to synchronize refresh operations with the decoders 910A-D and the bank control logic 906. In response to the decoded row address, the activated row address latch and decoder 910A-D applies various signals to a corresponding memory bank 912A-D to activate a row of memory cells corresponding to the decoded row address. Each memory bank 912A-D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A-D and the bank control logic circuit 906 uses the refresh bank address from the refresh counter 908 when the memory device 900 operates in an auto-refresh or self-refresh mode of operation in response to an auto- or self-refresh command being applied to the memory device 900, as will be appreciated by those of ordinary skill in the art.

A column address is applied on the ADDR bus after the row and bank addresses, and the address register 902 applies the column address to a column address counter and latch 914 which, in turn, latches the column address and applies the latched column address to a plurality of column decoders 916A-D. The bank control logic 906 activates the column decoder 916A-D corresponding to the received bank address, and the activated column decoder decodes the applied column address. Depending on the operating mode of the memory device 900, the column address counter and latch 914 either directly applies the latched column address to the decoders 916A-D, or applies a sequence of column addresses to the decoders starting at the column address provided by the address register 902. In response to the column address from the counter and latch 914, the activated column decoder 916A-D applies decode and control signals to an I/O gating and data masking circuit 918 which, in turn, accesses memory cells corresponding to the decoded column address in the activated row of memory cells in the memory bank 912A-D being accessed.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. A data driver 924 sequentially receives the N/2 bit words from the multiplexer 922 and also receives a data strobe signal DQS from a strobe signal generator 926 and a delayed clock signal CLKDEL from the delay-locked loop 923. The DQS signal is used by an external circuit such as a memory controller (not shown) in latching data from the memory device 900 during read operations. In response to the delayed clock signal CLKDEL, the data driver 924 sequentially outputs the received N/2 bits words as a corresponding data word DQ, each data word being output in synchronism with a rising or falling edge of a CLK signal that is applied to clock the memory device 900. The data driver 924 is coupled to a calibration circuit 925 to match the impedance of the data driver 924 to an external circuit to more accurately drive the data DQ to external terminals. The data driver 924 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the delay-locked loop 923 is a delayed version of the CLK signal, and the delay-locked loop 923 adjusts the delay of the CLKDEL signal relative to the CLK signal to ensure that the DQS signal and the DQ words are placed on the DATA bus in synchronism with the CLK signal. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 928 receives each DQ word and the associated DM0-X signals, and applies these signals to input registers 930 that are clocked by the DQS signal. In response to a rising edge of the DQS signal, the input registers 930 latch a first N/2 bit DQ word and the associated DM0-X signals, and in response to a falling edge of the DQS signal the input registers latch the second N/2 bit DQ word and associated DM0-X signals. The input register 930 provides the two latched N/2 bit DQ words as an N-bit word to a write FIFO and driver 932, which clocks the applied DQ word and DM0-X signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A-D subject to the DM0-X signals, which may be used to selectively mask bits or groups of bits in the DQ words (i.e., in the write data) being written to the addressed memory cells.

A control logic and command decoder 934 receives a plurality of command and clocking signals over a control bus CONT, from, for example, an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 534 latches and decodes an applied command, and generates a sequence of clocking and control signals that control the components 902-932 to execute the function of the applied command. The clock enable signal CKE enables clocking of the command decoder 934 by the clock signals CLK, CLK*. The command decoder 934 latches command and address signals at positive edges of the CLK, CLK* signals (i.e., the crossing point of CLK going high and CLK* going low), while the input registers 930 and data drivers 924 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

Figure 10:
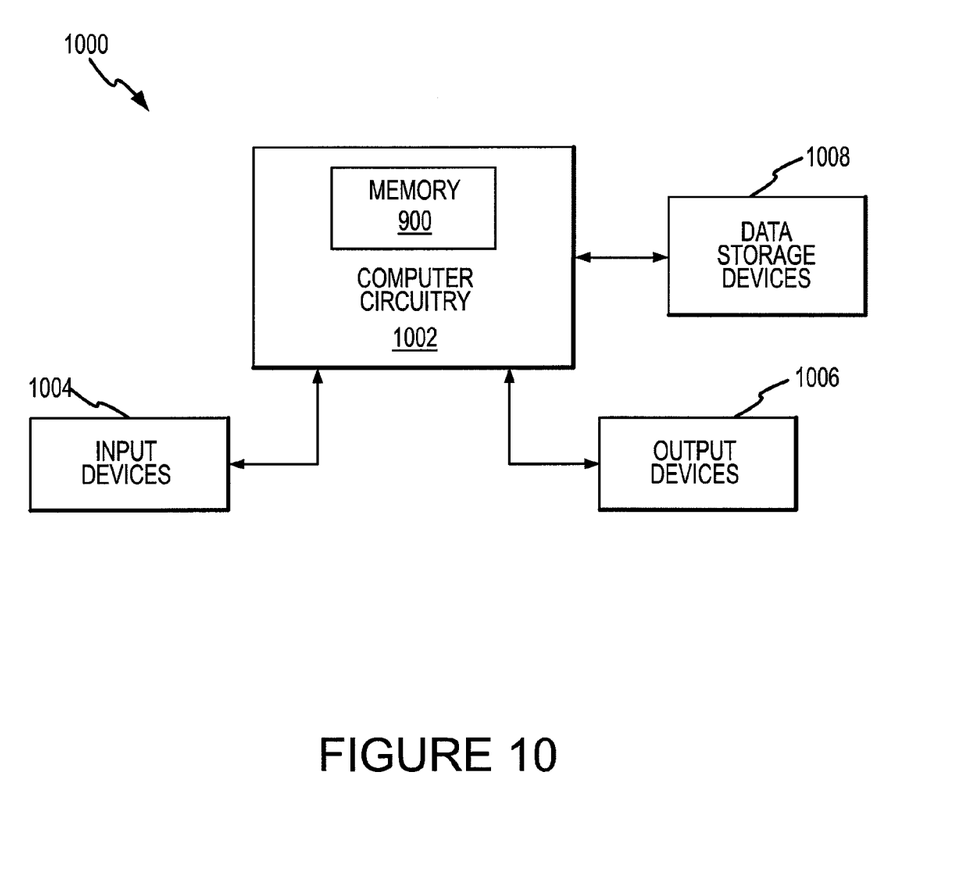
FIG. 10 is a functional block diagram illustrating a computer system including the memory device of FIG. 9.

FIG. 10 is a block diagram of a computer system 1000 including computer circuitry 1002 including the memory device 900 of FIG. 9. Typically, the computer circuitry 1002 is coupled through address, data, and control buses to the memory device 900 to provide for writing data to and reading data from the memory device. The computer circuitry 1002 includes circuitry for performing various computing functions, such as executing specific software to perform specific calculations or tasks. In addition, the computer system 1000 includes one or more input devices 1004, such as a keyboard or a mouse, coupled to the computer circuitry 1002 to allow an operator to interface with the computer system. The computer system 1000 may also include one or more output devices 1006 coupled to the computer circuitry 1002, such as a printer and a video terminal. One or more data storage devices 1008 may also be coupled to the computer circuitry 1002 to store data or retrieve data from external storage media (not shown). Examples of conventional storage devices 1008 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. A calibration circuit comprising:
   a driver circuit having a plurality of calibration transistors configured to receive a plurality of adjustment signals, the driver circuit operable to generate a first output signal having a value corresponding to the plurality of adjustment signals;
   a comparator circuit coupled to the driver circuit to receive the first output signal, the comparator circuit operable to generate a first control signal determined by the difference between the value of the first output signal and a predetermined value, and the comparator circuit further operable to generate a second control signal determined by whether the first output signal is greater than the predetermined value; and
   a binary searcher coupled to receive the first and second control signals, and operable to select either a relatively larger binary step count or a relatively smaller binary step count in response to the first control signal and determine the upwards or downwards direction of the selected binary step count in response to the second control signal, the binary searcher further operable to adjust the plurality of calibration transistors in accordance with the selected binary step count and in the selected direction of the count.

2. The calibration circuit of claim 1 wherein the binary searcher is further configured to select a relatively larger step size if the value of the first output signal is greater than a predetermined threshold value and to select a relatively smaller step size if the value of the first output signal is less than the predetermined threshold value.

3. The calibration circuit of claim 1 wherein the driver circuit further comprises a pull-up circuit to adjust a pull-up impedance of the driver.

4. The calibration circuit of claim 1 wherein the driver circuit is further configured to replicate a pull-up circuit of an output driver and to use the replicated pull-up circuit to calibrate the output driver.

5. The calibration circuit of claim 1 wherein the driver circuit further comprises a pull-down circuit to adjust a pull-down impedance of the driver.

6. The calibration circuit of claim 1 wherein the driver circuit is further configured to replicate a pull-down circuit of an output driver and to use the replicated pull-down circuit to calibrate the output driver.

7. A memory device, comprising:
   an address bus;
   a control bus;
   a data bus;
   an address decoder coupled to the address bus;
   a read/write circuit coupled to the control bus;
   an array of memory cells coupled to the address decoder, control circuit, and read/write circuit;
   an output driver circuit for outputting data read from the array of memory cells; and
   a calibration circuit for a driver comprising:
      a driver circuit having a plurality of calibration transistors configured to receive a plurality of adjustment signals, the driver circuit operable to generate a first output signal having a value corresponding to the plurality of adjustment signals;
      a comparator circuit coupled to the driver circuit to receive the first output signal, the comparator circuit operable to generate a first control signal determined by the difference between the value of the first output signal and a predetermined value, and the comparator circuit further operable to generate a second control signal determined by whether the first output signal is greater than the predetermined value; and
      a binary searcher coupled to receive the first and second control signals, and operable to select either a relatively larger binary step count or a relatively smaller binary step count in response to the first control signal and determine the upwards or downwards direction of the selected binary step count in response to the second control signal, the binary searcher further operable to adjust the plurality of calibration transistors in accordance with the selected binary step count and in the selected direction of the count.

8. The memory device of claim 7 wherein the comparator circuit further comprises a filter configured to receive the first output signal and operable to determine whether the first output signal is greater than, less than or equal to the predetermined value, and further configured to determine the binary state of first output signal.

9. The memory device of claim 7 wherein the driver circuit further comprises a pull-up circuit to adjust a pull-up impedance of the driver.

10. The memory device of claim 7 wherein the driver circuit is further configured to replicate a pull-up circuit of an output driver and to use the replicated pull-up circuit to calibrate the output driver.

11. A computer system, comprising:
    a data input device;
    a data output device;
    a processor coupled to the data input and output devices; and
    a memory device coupled to the processor, the memory device comprising:
       an address bus;
       a control bus;
       a data bus;
       an address decoder coupled to the address bus;
       a read/write circuit coupled to the control bus;

an array of memory cells coupled to the address decoder, control circuit, and read/write circuit;

an output driver circuit for outputting data read from the array of memory cells; and a calibration circuit for a driver comprising:
  a driver circuit having a plurality of calibration transistors configured to receive a plurality of adjustment signals, the driver circuit operable to generate a first output signal having a value corresponding to the plurality of adjustment signals;
  a comparator circuit coupled to the driver circuit to receive the first output signal, the comparator circuit operable to generate a first control signal determined by the difference between the value of the first output signal and a predetermined value, and the comparator circuit further operable to generate a second control signal determined by whether the first output signal is greater than the predetermined value; and
  a binary searcher coupled to receive the first and second control signals, and operable to select either a relatively larger binary step count or a relatively smaller binary step count in response to the first control signal and determine the upwards or downwards direction of the selected binary step count in response to the second control signal, the binary searcher further operable to adjust the plurality of calibration transistors in accordance with the selected binary step count and in the selected direction of the count.

12. The computer system of claim 11 wherein the driver circuit further comprises a pull-up circuit to adjust a pull-up impedance of the driver.

13. The computer system of claim 11 wherein the driver circuit is further configured to replicate a pull-up circuit of an output driver and to use the replicated pull-up circuit to calibrate the output driver.

14. The computer system of claim 11 wherein the driver circuit further comprises a pull-down circuit to adjust a pull-down impedance of the driver.

15. The computer system of claim 11 wherein the driver circuit is further configured to replicate a pull-down circuit of an output driver and to use the replicated pull-down circuit to calibrate the output driver.

16. A method for calibrating a driver, the method comprising:
  comparing the output impedance of a driver to a target output impedance to determine if the output impedance is within a range of the target output impedance;
  adjusting the output impedance using a first adjustment type if the output impedance is within the predetermined range of the target impedance; and
  adjusting the output impedance of the driver using a second adjustment type if the output impedance is outside the predetermined range of the target impedance.

17. The method of claim 16 wherein comparing the output impedance of a driver to a target output impedance further comprises:
  comparing the output impedance of a driver to a value above the target output impedance;
  comparing the output impedance of the driver to a value below the target output impedance;
  comparing the output impedance of the driver to the target output impedance; and
  calculating an adjustment signal to adjust the output impedance of the driver to best match the target output impedance.

18. The method of claim 16 wherein comparing the output impedance of a driver to a target output impedance further comprises determining the value of the difference in magnitude between the output impedance of the driver and the target output impedance.

19. The method of claim 18 wherein adjusting the output impedance using a first adjustment type comprises counting a number of binary steps, and wherein adjusting the output impedance of the driver using a second adjustment type comprises counting a number of binary substeps in smaller increments than the binary steps.

20. The method of claim 16 further comprising using a replicate pull-down circuit of an output driver for generating a calibration signal to apply to an actual output driver.

21. A method for calibrating a driver, the method comprising:
  comparing the output impedance of the driver to a target output impedance to determine if the output impedance is within a first range of the target output impedance or a second range of the target output impedance;
  adjusting the output impedance of the driver in binary steps if the output impedance is within a first range of the target output impedance;
  adjusting the output impedance of the driver in binary substeps if the output impedance is within a second range of the target output impedance;
  repeating at least one comparison and adjustment of the output impedance of the driver to a target output impedance; and
  outputting a final impedance of the driver based on the at least one comparison.

22. The method of claim 21 wherein comparing the output impedance of a driver to a target output impedance further comprises:
  comparing the output impedance of a driver to a value above the target output impedance;
  comparing the output impedance of the driver to a value below the target output impedance;
  comparing the output impedance of the driver to the target output impedance; and
  calculating an adjustment signal to adjust the output impedance of the driver to best match the target output impedance.

23. The method of claim 21 wherein comparing the output impedance of a driver to a target output impedance further comprises determining the value of the difference in magnitude between the output impedance of the driver and the target output impedance.

24. The method of claim 21 further comprising using a replicate pull-down circuit of an output driver for generating a calibration signal to apply to an actual output driver.

25. The method of claim 21 further comprising using a replicate pull-up circuit of an output driver for generating a calibration signal to apply to an actual output driver.

* * * * *